United States Patent
Betts et al.

(10) Patent No.: US 10,145,930 B1
(45) Date of Patent: Dec. 4, 2018

(54) METHOD AND SYSTEM FOR PHASE SYNCHRONIZATION AND CALIBRATION OF A MULTIPORT VECTOR NETWORK ANALYZER USING A SINGLE PHASE REFERENCE

(71) Applicant: Keysight Technologies, Inc., Minneapolis, MN (US)

(72) Inventors: Loren C. Betts, Rohnert Park, CA (US); Joel P. Dunsmore, Sebastopol, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 200 days.

(21) Appl. No.: 14/871,384

(22) Filed: Sep. 30, 2015

(51) Int. Cl.
G01R 35/00 (2006.01)
G01R 23/20 (2006.01)
G01R 27/06 (2006.01)

(52) U.S. Cl.
CPC ........... *G01R 35/005* (2013.01); *G01R 23/20* (2013.01); *G01R 27/06* (2013.01)

(58) Field of Classification Search
CPC .............. G01R 31/2884; G01R 31/282; G01R 31/2853; G01R 31/2836; H03B 5/32
USPC ................. 324/750.02, 327, 331, 537, 750.3
See application file for complete search history.

(56) References Cited

U.S. PATENT DOCUMENTS

| | | | | |
|---|---|---|---|---|
| 5,103,195 A * | 4/1992 | Dunsmore | ................ | H01P 1/15 327/404 |
| 6,018,246 A * | 1/2000 | Dunsmore | ............. | G01R 27/28 324/638 |
| 6,060,888 A * | 5/2000 | Blackham | ............... | G01R 27/28 324/601 |
| 7,082,067 B2 * | 7/2006 | Venkatraman | ......... | G11C 29/50 365/154 |
| 7,205,854 B2 * | 4/2007 | Liu | .................. | G01R 31/31727 324/750.3 |
| 7,739,063 B2 | 6/2010 | Betts et al. | | |
| 8,095,104 B2 * | 1/2012 | Kawae | ..................... | G06F 1/04 331/186 |

(Continued)

FOREIGN PATENT DOCUMENTS

WO 2014064453 A2 5/2014

OTHER PUBLICATIONS

Dunsmore, "A New Calibration Method for Mixer Delay Measurements that Requires No Calibration Mixer", Proceedings of the 41st European Microwave Conference, Oct. 10-13, 2011, Manchester, UK.

(Continued)

*Primary Examiner* — Giovanni Astacio-Oquendo

(57) ABSTRACT

A method is provided for calibrating a multiport measurement system having a local oscillator and a respective receiver associated with each port. The method includes performing a relative calibration by vector calibrating ports of the multiport measurement system and generating relative error-correction terms for the ports. Further, the method includes performing an absolute calibration by calibrating an amplitude response of the receivers of the multiport measurement system, and removing a local oscillator unknown phase response using a single phase reference coupled to a vector calibrated port and transferring cross-frequency phase correction terms from this vector calibrated port to the receivers of the other vector calibrated ports.

20 Claims, 5 Drawing Sheets

(56) References Cited

U.S. PATENT DOCUMENTS 8,508,241 B2    8/2013  Heuermann

OTHER PUBLICATIONS

Heuermann, "Calibration of a Network Analyzer Without a Thru Connection for Nonlinear and Multiport Measurements", IEEE Transactions on Microwave Theory and Techniques, vol. 56, No. 11, Nov. 2008.

* cited by examiner

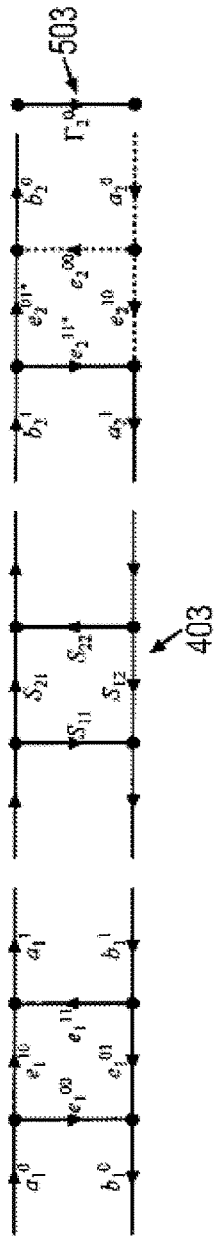
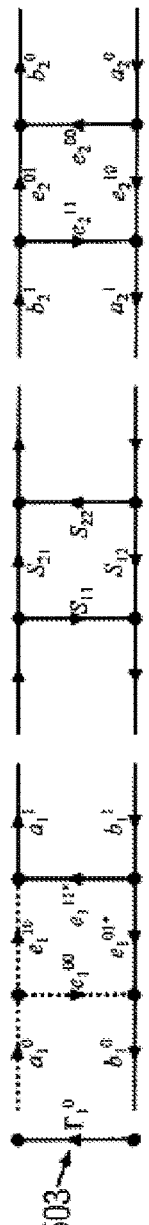
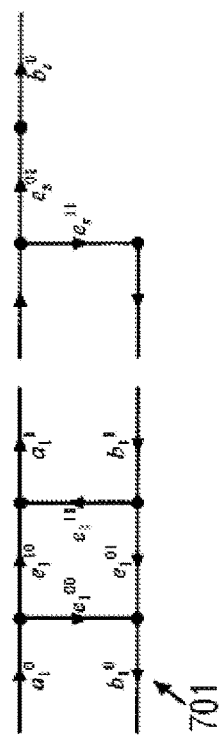
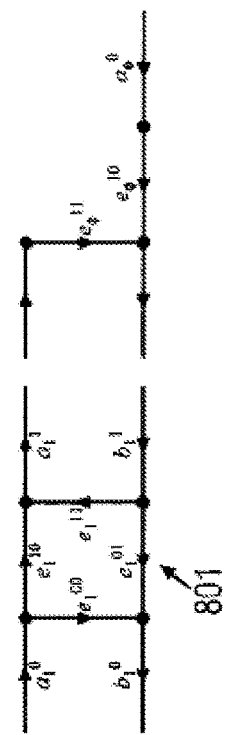
FIG. 6A
FIG. 6B
FIG. 7
FIG. 8

METHOD AND SYSTEM FOR PHASE SYNCHRONIZATION AND CALIBRATION OF A MULTIPORT VECTOR NETWORK ANALYZER USING A SINGLE PHASE REFERENCE

BACKGROUND

Accurate nonlinear measurements on a device under test (DUT) performed by a measurement system, for example a Multiport Vector Network Analyzer (MVNA), may improve with relative and absolute calibration to be performed on the measurement equipment itself.

FIG. 1 is a schematic diagram of a traditional four-wave reflectometer 101 commonly used in measurement systems, for example a VNA. The VNA uses an RF source 109 and a source transfer switch 105 to characterize a two port electrical system, referred to as a device under test (DUT) 103. A local oscillator (LO) 107 is identified in the four-wave reflectometer 101. The VNA is able to measure voltage waves of the four-wave reflectometer in the forward and reverse stimulation directions simultaneously. The reflectometers separate the incident and reflected voltage waves of the DUT 103. These voltage waves are then corrected so that the actual performance (using Scattering Parameters or absolute voltage waves) of the DUT 103 can be accurately measured.

In FIG. 1, the variables used are described as:

$a_x^y$=the incident voltage wave (independent variable); and
$b_x^y$=the reflected voltage wave (dependent variable),
where x is the port number and y is the error term designation.

Scattering Parameters ("S-parameters") are properties used in electrical systems to describe the electrical behavior of linear electrical networks when undergoing various steady state stimuli by small signals. The reflectometer 101 can be characterized using S-parameters described in Equations 1.

$$b_1^1 = a_1^1 S_{11} + a_2^1 S_{12}$$
$$b_2^1 = a_2^1 S_{22} + a_1^1 S_{21}$$
$$\begin{bmatrix} b_1^1 \\ b_2^1 \end{bmatrix} = \begin{bmatrix} S_{11} & S_{12} \\ S_{21} & S_{22} \end{bmatrix} \begin{bmatrix} a_1^1 \\ a_2^1 \end{bmatrix}$$

Equations 1

The DUT 103 S-parameters can be calculated from the corrected voltage waves. A corrected voltage wave is one where the measurement system's systematic errors have been removed by performing a calibration and error correction on un-corrected voltage waves, resulting in accurate voltage waves from the DUT. To apply the S-parameters to the DUT, all four of the corrected independent and dependent voltage waves are measured, and then applied to the generalized S-parameter matrix formulations in Equations 1.

Imperfections in the VNA hardware make it desirable to perform error correction to get an accurate representation of the actual voltage waves of the DUT.

A thorough way to characterize the electrical system is through error models. Error models account for systematic errors. Vector error correction is an accurate form of error correction as it accounts for major sources of systematic error.

Vector error correction is a process of characterizing systematic errors by measuring known calibration standards, and then removing the effects of these errors from subsequent measurements. Vector error correction is an example of relative error correction.

A majority of VNAs have a 12-term error model for error correction built into the VNA. The 12-term error model is divided into two sections: a forward and reverse error model. Two-port calibration usually requires twelve measurements on four known hardware standards, short-open-load-through or SOLT. The two-port calibration quantifies twelve systematic error correction terms that are used for subsequent measurements.

An 8-term error model is another generalized error model to correct systematic errors. A benefit of using this model is the ability to supply a signal on both ports at the same time without affecting the error correction process. Any differences to the match seen at the source with respect to the match seen at the terminating load are measured and accounted for. This is performed with all four incident and reflected waves. This identifies the 8-term error model as a single mathematical model that can account for measurements when either port 1, port 2, or both port 1 and 2 are supplying a signal when making both forward and reverse measurements. Error adapters or error correction terms on each side (port 1 and port 2) of the measurement system relate the measured waves to the corrected waves and have no implied relationship to the direction of device stimulation or changes in source or load match of the VNA.

A third error correction model, the 16-term error model, can also be used to correct the systematic errors in a measurement system. However, the 16-term error model is an elaborate process and is difficult to implement practically.

As mentioned above, VNAs utilize vector error correction to correct the systematic measurement errors. In vector error correction, the input frequency to the DUT 103 is the same as the output frequency of the DUT 103. The error correction (typically 12-term) is applied to ratios of measurements (S11, S21, etc). The 12 and 8-term error models are implicitly known as linear models.

Present error correction may be insufficient to meet the needs of characterizing complex electrical systems that exhibit nonlinear behavior. One challenging aspect of measurements with the VNA is to get error corrected nonlinear measurements for the DUT 103.

Error correction for nonlinear measurements can be described as two types: relative and absolute. With relative error correction, linear systematic measurement errors are adjusted for by the vector error correction or by using hardware standards common in the art.

Absolute error correction relies on the absolute amplitude of each measured frequency component. In addition to this, the cross-frequency phase of each frequency component is related to a common time base. The cross-frequency phase is the relative phase difference between each frequency in the measured spectrum. Relating the phase in this way provides a phase difference between all the measured frequency components.

Conventional VNAs may not accurately measure the nonlinear behavior of the DUT 103 wherein the absolute amplitude and cross-frequency phase of the measured spectral content is required. As a result, a time domain signal representation may not be constructed accurately from the frequency domain measurements of the waveforms emanating from a nonlinear DUT 103. Additionally, this lack of accuracy may inhibit the generation of precise nonlinear behavior models, primarily for use in simulation and design.

So, typical reasons to calibrate the cross-frequency phase response include measuring offset frequency phase characteristics of a frequency converter (e.g. mixer, multiplier), measuring phase relationships between frequencies of a signal, and measuring nonlinear characteristics of components (IMD phase, harmonic phase).

In prior art approaches, calibrating a multiport, mixer-based, VNA's cross-frequency phase response may involve the following aspects.

First, Local Oscillator (LO) unknown phase is removed by utilizing a Synchronization Phase Reference connected to an unused VNA port. In a mixer-based VNA, RF signals are down-converted to an Intermediate Frequency (IF) using a mixer driven by an LO. The LO frequency is changed to measure RF signals at different frequencies. As the frequency of the LO is changed an unknown LO phase is introduced into the VNA system. This unknown LO phase is removed using the Synchronization Phase Reference continuously connected to an unused port mixer that is driven with the same LO as the remaining VNA port mixers.

Second, a relative calibration is performed by Vector calibrating the remaining VNA ports using a vector calibration device or devices. This generates a Relative error-correction matrix on each VNA port (but not the port with the Synchronization Phase Reference attached).

Thirdly, an absolute Calibration is performed by calibrating the cross-frequency phase response of the multiport VNA utilizing a Calibration Phase Reference and error terms generated in the relative calibration. The Calibration Phase Reference is connected to a port on the VNA that has a relative calibration previously performed. And the un-ratioed amplitude response of the receivers of the VNA is calibrated utilizing a power sensor. The power sensor is connected to a port on the VNA that has a relative calibration previously performed.

Lastly, once all other ports of the measurement system (i.e. VNA), except the port with the Synchronization Phase Reference coupled thereto, are calibrated in relative and absolute terms, the component, or signal, at the DUT is then measured.

The drawback to this approach is that two separate phase reference devices are needed including one for synchronization and one for calibration.

SUMMARY

In accordance with a representative embodiment, a method is provided for calibrating a multiport measurement system having a local oscillator and a respective receiver associated with each port. The method includes performing a relative calibration by vector calibrating ports of the multiport measurement system and generating relative error-correction terms for the ports. Further, the method includes performing an absolute calibration by calibrating an amplitude response of the receivers of the multiport measurement system, and removing a local oscillator unknown phase response using a phase reference coupled to a vector calibrated port and transferring cross-frequency phase correction terms from this vector calibrated port to the receivers of the other vector calibrated ports.

In certain embodiments, performing the relative calibration includes the use of a vector calibration device for vector calibrating the ports. For example, the vector calibration device may be an electronic calibration module or a short/open/load/through calibration kit.

In certain embodiments, performing the absolute calibration includes the use of an amplitude calibration device coupled to a vector calibrated port for calibrating the un-ratioed amplitude response of the receivers. For example, the amplitude calibration device comprises a power sensor.

In various embodiments, generating relative error-correction terms may include generating a matrix of relative error-correction coefficients.

In certain embodiments, transferring cross-frequency phase correction terms to the receivers of the other vector calibrated ports is based upon the relative calibration.

The multiport measurement system may be a multiport vector network analyzer, a multiport oscilloscope or a multiport vector signal analyzer.

Another embodiment is directed to a method of operating a multiport vector network analyzer for testing a device under test (DUT), the multiport vector network analyzer having a local oscillator and a respective receiver associated with each port. The method includes calibrating the multiport vector network analyzer including performing a relative calibration by vector calibrating ports of the multiport vector network analyzer by coupling a vector calibration device to each of the ports and generating relative error-correction terms for the ports. The method includes performing an absolute calibration by calibrating an amplitude response of the receivers of the multiport vector network analyzer by coupling an amplitude calibration device to one of the vector calibrated ports, and removing a local oscillator unknown phase response by coupling a phase reference to a vector calibrated port and transferring cross-frequency phase correction terms from this vector calibrated port to the receivers of the other vector calibrated ports. Also, the method includes testing the DUT using the ports of the multiport vector network analyzer to apply and receive measurement signals.

Another embodiment is directed to a non-transitory computer-readable storage medium having stored therein machine readable instructions configured to be executed by a multiport measurement system having a local oscillator and a respective receiver associated with each port, the machine readable instructions being configured to cause the multiport measurement system to execute a process for calibrating the multiport measurement system. The process includes: performing a relative calibration by vector calibrating ports of the multiport measurement system and generating relative error-correction terms for the ports; and performing an absolute calibration by calibrating an amplitude response of the receivers of the multiport measurement system, and removing a local oscillator unknown phase response using a phase reference coupled to a vector calibrated port and transferring cross-frequency phase correction terms from this vector calibrated port to the receivers of the other vector calibrated ports.

The present embodiments provide methods, devices and systems that may provide calibration of a measurement system where an accurate representation of the input and output waves with reference to the DUT is required. The methods can be applied to a measurement system that is capable of measuring complex-valued (absolute amplitude and cross-frequency phase) forward and reverse traveling waves.

The approach of the present embodiments eliminates the constraint of using two separate phase references. Instead, only a single phase reference is utilized for both synchronization and calibration.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIGS. 6A-6B are schematic diagrams illustrating modified 12-term error model for the forward and reverse direction;

FIG. 7 is a schematic diagram illustrating the amplitude calibration device and error adapter model; and FIG. 8 is a schematic diagram illustrating a model of the single phase reference device and corresponding error adapter model.

DETAILED DESCRIPTION

Figure 1:
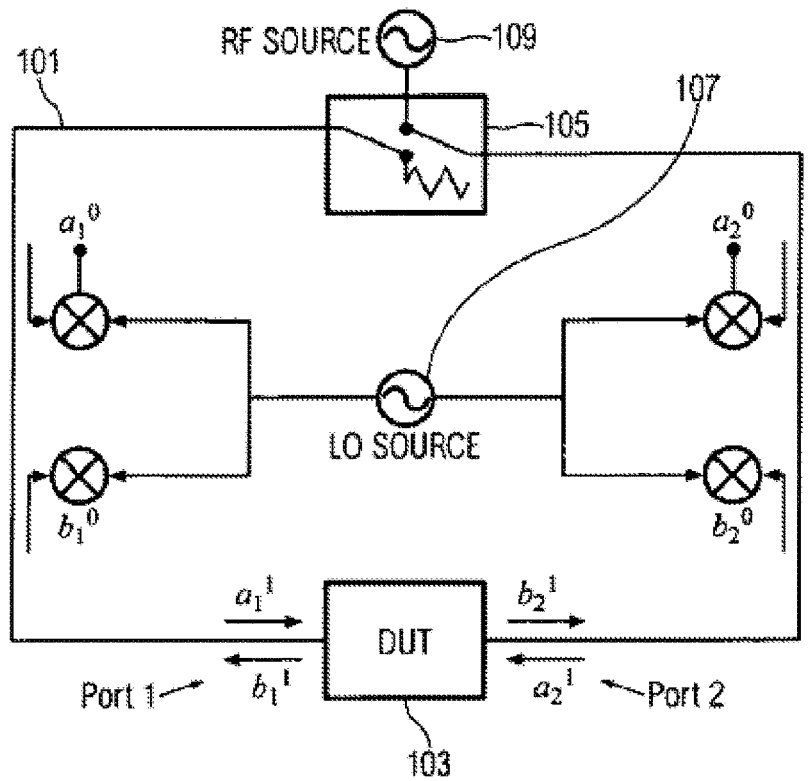
FIG. 1 is a schematic diagram illustrating a conventional four reflectometer-based measurement system and two-port device under test.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

Relative terms may be used to describe the various elements' relationships to one another, as illustrated in the accompanying drawings. These relative terms are intended to encompass different orientations of the device and/or elements in addition to the orientation depicted in the drawings.

It will be understood that when an element is referred to as being "coupled to" another element, it can be directly coupled, or intervening elements may be present.

The term computer readable-storage medium also refers to various types of recording media capable of being accessed by the computer device via a network or communication link. For example a data may be retrieved over a modem, over the internet, or over a local area network. References to a computer-readable storage medium should be interpreted as possibly being multiple computer-readable storage mediums. Various executable components of a program or programs may be stored in different locations. The computer-readable storage medium may for instance be multiple computer-readable storage medium within the same computer system. The computer-readable storage medium may also be computer-readable storage medium distributed amongst multiple computer systems or computing devices.

'Computer memory' or 'memory' is an example of a computer-readable storage medium. Computer memory is any memory which is directly accessible to a processor. Examples of computer memory include, but are not limited to: RAM memory, registers, and register files. References to 'computer memory' or 'memory' should be interpreted as possibly being multiple memories. The memory may for instance be multiple memories within the same computer system. The memory may also be multiple memories distributed amongst multiple computer systems or computing devices.

'Computer storage' or 'storage' is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa. References to 'computer storage' or 'storage' should be interpreted as possibly including multiple storage devices or components. For instance, the storage may include multiple storage devices within the same computer system or computing device. The storage may also include multiple storages distributed amongst multiple computer systems or computing devices.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'user interface' as used herein is an interface which allows a user or operator to interact with a computer or computer system. A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer to indicate the effects of the operator's control or manipulation. The display of data or information on a display or a graphical user interface is an example of providing information to an operator. The receiving of data through a touch screen, keyboard, mouse, trackball, touchpad, pointing stick, graphics tablet, joystick, gamepad, webcam, headset, gear sticks, steering wheel, wired glove, wireless remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Initially, it is pointed out that to design, characterize, and troubleshoot devices and systems (e.g. communication devices and systems including volatile memories), engineers need to measure a variety of characteristics of the device signals. To make such measurements, engineers generally use oscilloscopes, vector network analyzers, vector signal analyzers and an associated probing system and display.

A vector network analyzer integrates a radio frequency source with built-in couplers for signal separation, a receiver, a display and a processor, for example.

Generally, measurement calibration is a process that improves measurement accuracy by using error correction arrays during signal processing to compensate for systematic measurement errors. Measurement calibration may also be referred to as called Cal, accuracy enhancement, and error correction. Measurement errors may be classified as random and systematic errors. Random errors, such as noise and connector repeatability are non-repeatable and not correctable by measurement calibration.

Systematic errors, such as directivity, matching, tracking and crosstalk, are the most significant errors in most RF measurements. Systematic errors are repeatable and for the most part correctable, though small residual errors may remain. These systematic errors may drift with time and temperature. Systematic errors are due to system frequency response, isolation between the signal paths, and mismatch in the test setup.

A vector network analyzer may generally have several methods of measuring and compensating for the test system errors to varying degrees of accuracy. Each method removes one or more of the systematic errors through vector error correction. Vector error correction is the process characterizing the systematic errors by measuring calibration standards (devices with known s-parameters) then mathematically removing the effects of the systematic errors from subsequent measurements on various DUTs.

Methods of calibration may involve the use of SOLT or shorts, opens, loads, and a through (direct connection of vector network analyzer test ports). The opens, shorts and loads are used to calibrate each vector network analyzer port for reflection measurements. The vector network analyzer measures each standard across a defined frequency band using a pre-defined number of points. The measurement of the opens, shorts and loads are used to solve for directivity, source match and reflection tracking for each port. The through is connected and typically four measurements are made including forward reflection to characterize forward load match, reverse reflection to characterize reverse load match, forward transmission to characterize forward transmission tracking, and reverse transmission to characterize reverse transmission tracking.

Figure 2:
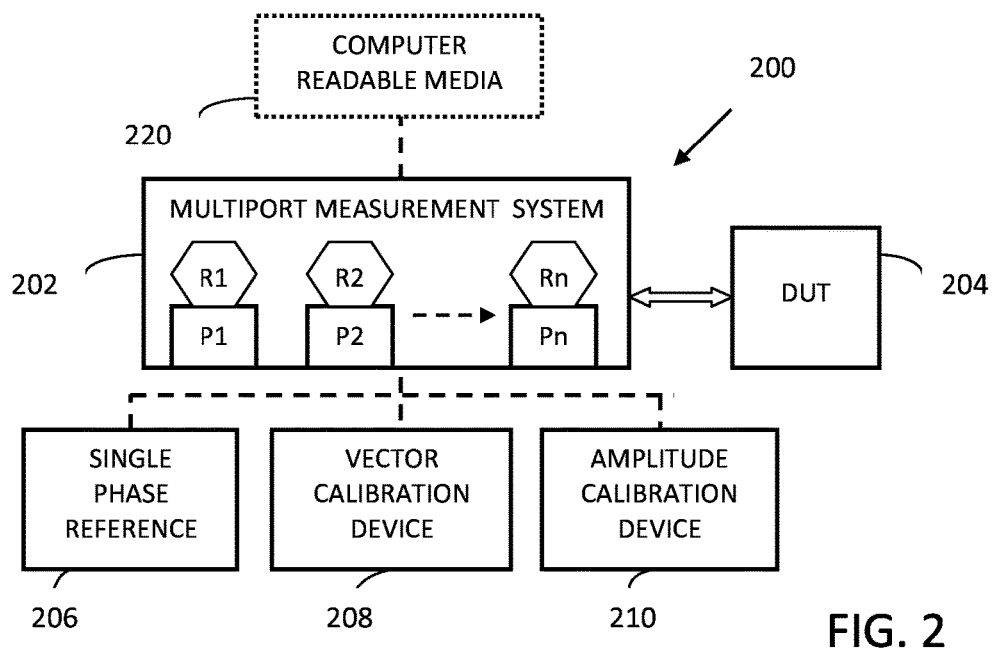
FIG. 2 is a block diagram illustrating a calibration setup for a multiport measurement system using the calibration method in accordance with features of the present invention.

Referring initially to FIG. 2, a calibration setup 200 for a multiport measurement system 202 using a calibration method in accordance with features of the present invention will now be described. As previously discussed, the multiport measurement system 202 may be a multiport vector network analyzer (MVNA), a multiport oscilloscope or a multiport vector signal analyzer. The multiport measurement system 202 is for analyzing parameters of a device under test (DUT) 204. As may be appreciated by those skilled in the art, the multi-port measuring system 202 may include a user interface and may be coupled to a display device and a probe via a hardware interface (not shown).

The multiport measurement system 202 may have any number of ports P1, P2 . . . Pn even though some of the following description may refer to two ports or four ports for convenience. The multiport measurement system 202 has a local oscillator LO and a respective receiver R1, R2 . . . Rn associated with each port P1, P2 . . . Pn.

The calibration set up 200 includes the use of a single phase reference device 206, a vector calibration device 208 and an amplitude calibration device 210 as will be discussed in further detail below. Also, FIG. 2 also illustrates a computer readable media 220 containing code for providing instructions to and for execution by the multiport measurement system 202. The computer readable media 220 can be, for example, a ROM, a RAM, a DVD, a hard drive, flash drive or other computer readable media known in the art. The code residing on the computer readable media 220 can be used by a Central Processing Unit (CPU) within the multiport measurement system 202 to execute the instructions. Alternatively, the code can be executed by a computer external to the multiport measurement system 202.

Figure 3A:
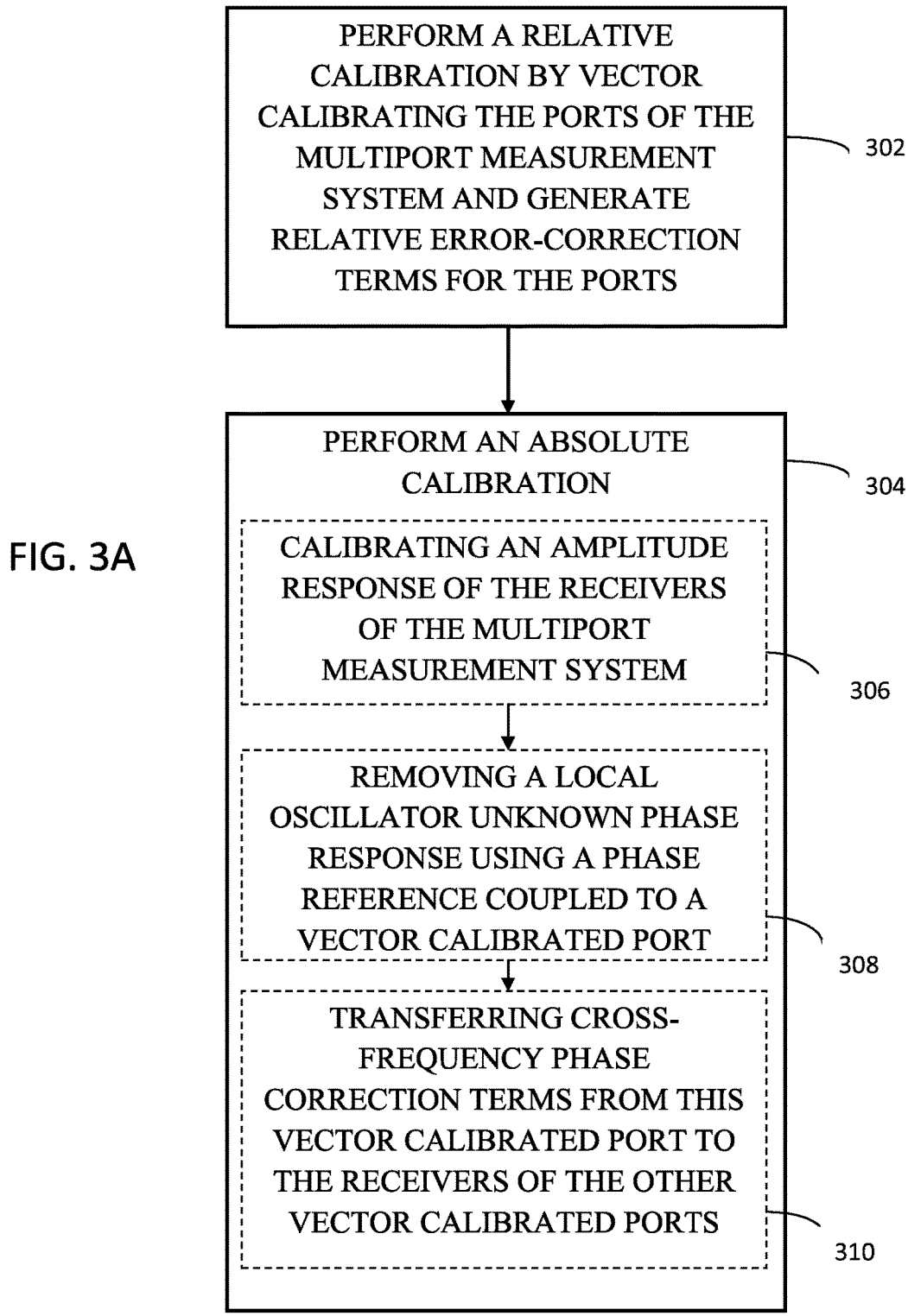
FIG. 3A is a flow chart illustrating a method for calibrating the multiport measurement system in accordance with features of a representative embodiment.

FIG. 3A is a flow chart illustrating a method for calibrating the multiport measurement system 202 in accordance with features of a representative embodiment.

The method includes, at block 302, a step to perform a relative calibration by vector calibrating ports P1-Pn of the multiport measurement system 202 and generating relative error-correction terms for the ports. In certain embodiments, performing the relative calibration includes the use of a vector calibration device 208 for vector calibrating the ports P1-Pn. For example, the vector calibration device 208 may be an electronic calibration (ecal) module or a short/open/load/through (SOLT) calibration kit, as discussed above.

In various embodiments, generating relative error-correction terms may include generating a matrix of relative error-correction coefficients, as will be discussed below.

Further, the method includes, at block 304, a step to perform an absolute calibration by calibrating 306 an amplitude response of the receivers R1-Rn of the multiport measurement system 202, and removing 308 a local oscillator unknown phase response using the single phase reference device 206 coupled to a vector calibrated port (e.g. port P1) and transferring 310 cross-frequency phase correction terms from this vector calibrated port P1 to the receivers R2-Rn of the other vector calibrated ports P2-Pn.

In certain embodiments, transferring cross-frequency phase correction terms to the receivers R2-Rn of the other vector calibrated ports P2-Pn is based upon the relative calibration 302.

In certain embodiments, performing the absolute calibration 304 includes the use of an amplitude calibration device 210 coupled to a vector calibrated port (e.g. P1) for calibrating the un-ratioed amplitude response of the receivers R1-Rn. For example, the amplitude calibration device 210 may be a power sensor.

Figure 3B:
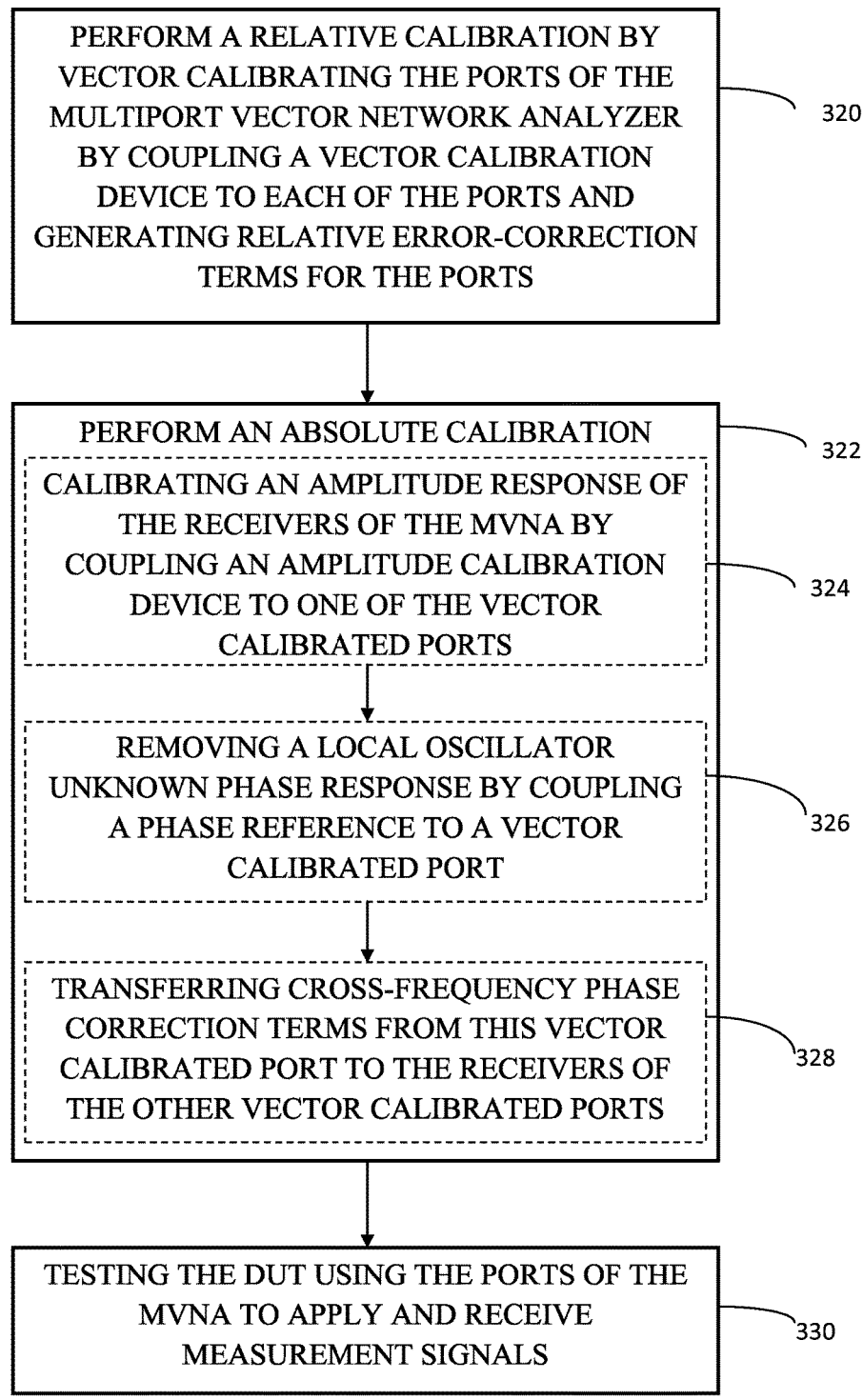
FIG. 3B is a flow chart illustrating a method of operating a multiport vector network analyzer for testing a DUT in accordance with features of a representative embodiment.

FIG. 3B is a flow chart illustrating a method of operating a multiport vector network analyzer (MVNA), e.g. as the multiport measurement system 202, for testing a DUT 204 in accordance with features of a representative embodiment.

The MVNA, e.g. as the multiport measurement system 202, has a local oscillator LO and a respective receiver R1-Rn associated with each port P1-Pn. The method includes calibrating the MVNA including performing 320 a relative calibration by vector calibrating ports P1-Pn of the MVNA by coupling a vector calibration device 208 to each of the ports P1-Pn and generating relative error-correction terms for the ports. Again, for example, the vector calibration device 208 may be an ecal module or a SOLT calibration kit, as discussed above.

The method includes performing 322 an absolute calibration by calibrating 324 an amplitude response of the receivers R1-Rn of the MVNA by coupling an amplitude calibration device 210 to one of the vector calibrated ports (e.g. port P1), and removing 326 a local oscillator unknown phase response by coupling the single phase reference device 206 to a vector calibrated port P1 and transferring 328 cross-frequency phase correction terms from this vector calibrated port P1 to the receivers R2-Rn of the other vector calibrated ports P2-Pn.

Also, the method includes testing 330 the DUT using the ports P1-Pn of the MVNA to apply and receive measurement signals.

Another embodiment is directed to a non-transitory computer-readable storage medium 220 having stored therein machine readable instructions configured to be executed by the multiport measurement system 202 having a local oscillator LO and a respective receiver R1-Rn associated with each port P1-Pn. The machine readable instructions are configured to cause the multiport measurement system 202 to execute a process for calibrating the multiport measurement system 202. The process includes the steps 302-310 described with reference to the flowchart in FIG. 3A discussed above.

Generally, a processor of the multi-port measuring system 202 may represent a control unit which can be implemented in numerous ways (e.g., such as with dedicated hardware) to perform various functions discussed herein. A processor is one example of the control unit or a component of the control unit, and may employ one or more microprocessors that may be programmed using software (e.g., microcode) to perform various functions discussed herein. The control unit may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, microcontrollers, application specific integrated circuits (ASICs), and field-programmable gate arrays (FPGAs).

The control unit may access a memory, such as test data storage, for instructions, as described above. The test data storage may be associated with one or more computer-readable non-transitory storage media (generically referred to herein as "memory," e.g., volatile and non-volatile computer memory such as random-access memory (RAM), read-only memory (ROM), programmable read-only memory (PROM), electrically programmable read-only memory (EPROM), electrically erasable and programmable read only memory (EEPROM), universal serial bus (USB) drive, floppy disks, compact disks, optical disks, magnetic tape, etc.). In some implementations, the computer-readable non-transitory storage media may be encoded with one or more programs that, when executed on the control unit, perform at least some of the functions discussed herein. Various computer-readable non-transitory storage media may be fixed within the control unit, or may be transportable, such that the one or more programs stored thereon can be loaded into a processor or controller so as to implement various aspects of the present teachings discussed herein. The terms "program" or "computer program" are used herein in a generic sense to refer to any type of computer code (e.g., software or microcode) that can be employed to program the control unit.

Figure 4:
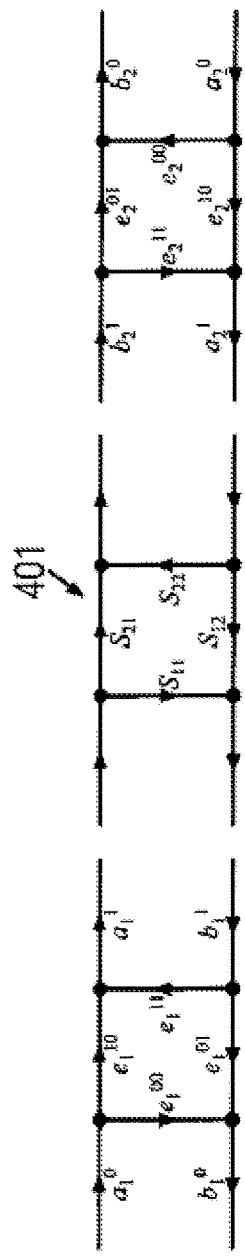
FIG. 4 is a schematic diagram illustrating an 8-term error model.

FIG. 4 illustrates an 8-term error correction model for a two-port version of the multiport measurement system 202.

The error adapters are described on each side of the S-parameter terms 401. The error adapters relate the measured waves to the corrected waves and do not have an implied relationship to the direction of device stimulation or changes in source and load match of the multiport measurement system 202.

In FIG. 4, the variable terms are defined as:

$a_1^0, a_2^0$=independent voltage waves;

$b_1^0, b_2^0$=dependent voltage waves;

$a_1^1, a_2^1$=incident voltage wave of port 1 and port 2; and $b_1^1, b_2^1$=are the reflected voltage wave of port 1 and port 2. Equations 2

The error correction terms are defined as $e_{port\ index}^{term\ index}$ and described as:

$e_1^{11}$ and $e_2^{11}$=port match terms;

$e_1^{01}, e_1^{10}, e_2^{01}$ and $e_2^{10}$=port tracking terms; and $e_1^{00}$ and $e_2^{00}$=port directivity terms. Equations 3

The 8-term error model allows for the non-ideal effects of the reflectometer 101 and the port switches to be contained in the error correction terms. A non-constant port match will cause an unaccounted for change in the match in the terminating port. This will result in a reflected signal in the $a_1^0$ (reverse direction) and the $a_2^0$ (forward direction) voltage waves of FIG. 1. To account for the changing characteristics of the source and load match, all four-voltage waves are measured.

Figure 5A:
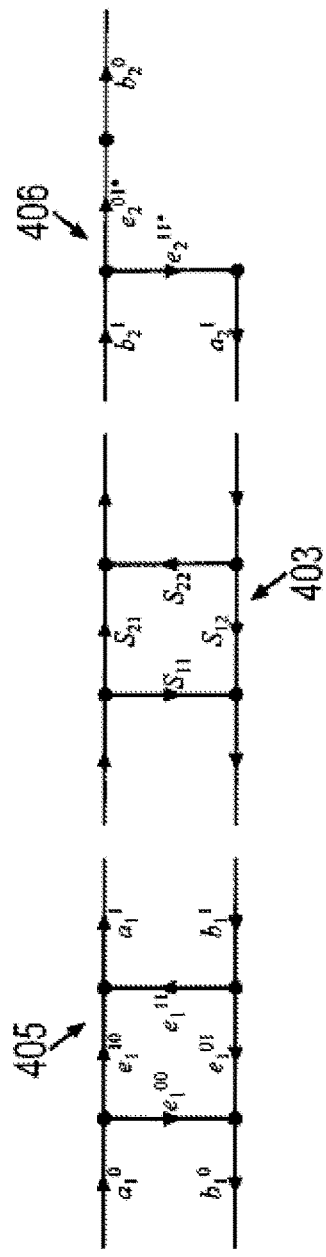
FIGS. 5A-5B are schematic diagrams illustrating a 12-term error model for the forward and reverse direction.
Figure 5B:
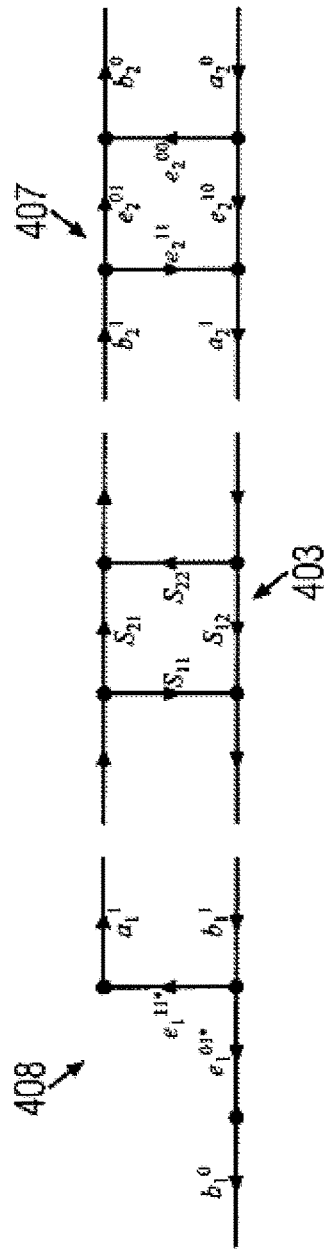

FIG. 5A and FIG. 5B describe a 12-term error model in forward and reverse directions respectively. In Equations 4 below, terminology commonly used in the art is associated with the error adapters 405, 406, 407 and 408 of the 12-term model in FIGS. 5A-B.

$e_1^{00}$=Port 1 Directivity($dp_1$)

$e_1^{11}$=Port 1 Source Match($smp_1$)

$e_2^{11}$*=Forward Load Match($lm_{fwd}$)

$e_1^{10}e_1^{01}$=Forward Reflection Tracking($rt_{fwd}$)

$e_1^{10}e_2^{01}$*=Forward Transmission Tracking($tt_{fwd}$)

$e_2^{00}$=Port 2 Directivity($dp_2$)

$e_2^{11}$=Port 2 Source Match($smp_2$)

$e_1^{11}$*=Reverse Load Match($lm_{rev}$)

$e_2^{10}e_2^{01}$=Reverse Reflection Tracking($rt_{rev}$)

$e_2^{10}e_1^{01}$*=Reverse Transmission Tracking($tt_{rev}$)  Equations 4

The '*' identifies a term in the 12-term model that is different to the term in the 8-term model. For example $e_2^{11}$* is the port match (specifically $lm_{fwd}$) of the 12-term model while $e_2^{11}$ is the port match of the 8-term model. The 12-term error model accounts for a change in load match by including a source match and a load match term. This is in contrast to the 8-term error model; the 8-term error model accounts for the match change by measuring all the incident and reflected (a and b) voltage waves and using a single port match term. Any changes in the source or load match of the port are sensed in the incident and reflected (a and b) voltage waves.

The 12-term error model is divided into two sections: the forward error model of FIG. 5A, and the reverse error model of FIG. 5B. The 12-term error model has the associated error adapters on each side of the measurement system 251 S-parameter terms 403. The error correction terms 405, 406, 407 and 408 on each side of the S-parameter terms 403 account for the hardware imperfections of port 1 and port 2 of the multiport measurement system 202 and associated cables connected to the DUT 204. The two models account for a different match (source and load) of the multiport measurement system 202 and corresponding hardware cables. This is dependent on whether the physical port is sourcing or receiving a signal as well as taking into account the imperfection of the source transfer switch 105 into consideration. As an example, consider a VNA using a single stimulus source and a port switch to change the direction from port P1 to port P2 and vise versa. First, the match of the port switch when the termination is switched into port P1 can be different when the termination is switched into port P2. Second, the match of the source when switched into port P1 can be different when the termination is switched into port P1. These differences are taken into account by separate models depending on the state of the port switch.

Converting the 12-term error model to the 8-term error model involves modifying the 12-term error model and then combining the forward and reverse sections of the 12-term error model. FIG. 6A illustrates a modified 12-term error model for the forward section. FIG. 6B illustrates a modified 12-term error model for the reverse section. Port match difference terms $\Gamma_1^0$, $\Gamma_2^0$ 503 are included in FIGS. 6A-B to relate the 12-term error model of FIGS. 5A-B to the 8-term error model of FIG. 4. The port match difference terms 503 aid in converting the 12-term error model to the 8-term error model. This is achieved by extracting out the port specific match terms from the error adapters in the forward and reverse directions. In this analysis, leakage terms are ignored.

The port match difference terms $\Gamma_1^0$, $\Gamma_2^0$ 503 correspond to the change in match of the terminating load (direction dependent). This can be thought of as the change in the port match error terms ($e_1^{11}$, $e_2^{11}$) when the source transfer switch 105 is changed to terminate the output of the DUT 261 instead of applying the source signal to the input of the DUT 204. A port specific load match term now exists for each direction.

Adding the port match difference terms 503 to the 12-term error model will require the inclusion of the additional error adapter terms ($e_1^{10}$, $e_1^{00}$, $e_2^{10}$, and $e_2^{00}$) to the models of FIGS. 6A-B. The relationship can be generated as shown in Equations 5.

$$e_1^{00} = dp_1$$

$$e_1^{11} = e_1^{11*} - \frac{e_1^{10}e_1^{01}\Gamma_1^0}{1-e_1^{00}\Gamma_1^0} lm_{rev} - \frac{rt_{fwd}\Gamma_1^0}{1-dp_1\Gamma_1^0} = smp_1$$

$$e_1^{10}e_1^{01} = rt_{fwd}$$

$$e_1^{10}e_2^{01} = e_1^{10}e_2^{01*}[1-e_2^{00}\Gamma_2^0] = tt_{fwd}[1-dp_2\Gamma_2^0]$$

$$\Gamma_1^0 = \frac{a_1^0}{b_1^0}$$

$$e_2^{00} = dp_2$$

$$e_2^{11} = e_2^{11*} - \frac{e_2^{10}e_2^{01}\Gamma_2^0}{1-e_2^{00}\Gamma_2^0} = lm_{fwd} - \frac{rt_{rev}\Gamma_2^0}{1-dp_2\Gamma_2^0} = smp_2$$

$$e_2^{10}e_2^{01} = rt_{rev}$$

$$e_2^{10}e_1^{01} = e_2^{10}e_1^{01*}[1-e_1^{00}\Gamma_1^0] = tt_{rev}[1-dp_1\Gamma_1^0]$$

$$\Gamma_2^0 = \frac{a_2^0}{b_2^0}$$

Equations 5

The terms $e_1^{11}$ and $e_2^{11}$, shown in Equations 5, are the calculated port match error terms (for port P1 and port P2 respectively). These terms correspond to terms $smp_1$ and $smp_2$ in the 12-term error model of Equations 4.

In the four wave reflectometer 101, all the independent ($a_1^0$, $a_2^0$) and dependent ($b_1^0$, $b_2^0$) voltage waves can be measured directly. The 12-term error model in FIGS. 6A-B is then utilized during relative error correction. The port match difference terms $\Gamma_1^0$, $\Gamma_2^0$ 503 can then be calculated as the ratio of these measurements as shown in the Equations 5 above. Equations 5 also provides a method of calculating the match terms directly from the 12-term error coefficients. This is illustrated in Equations 6.

$$e_1^{11} = e_1^{11*} - \frac{e_1^{10}e_1^{01}\Gamma_1^0}{1-e_1^{00}\Gamma_1^0} = lm_{rev} - \frac{rt_{fwd}\Gamma_1^0}{1-dp_1\Gamma_1^0}$$

$$e_1^{11} - lm_{rev} = -\frac{rt_{fwd}\Gamma_1^0}{1-dp_1\Gamma_1^0}$$

$$[e_1^{11} - lm_{rev}][1-dp_1\Gamma_1^0] = -rt_{fwd}\Gamma_1^0$$

$$\Gamma_1^0[-e_1^{11}dp_1 + lm_{rev}dp_1 + rt_{fwd}] = -e_1^{11} + lm_{rev}$$

$$\Gamma_1^0 = \frac{lm_{rev}-e_1^{11}}{rt_{fwd}+dp_1[lm_{rev}-e_1^{11}]} \text{ and since } e_1^{11} \text{ is } smp_1$$

$$\Gamma_1^0 = \frac{lm_{rev}-smp_1}{rt_{fwd}+dp_1[lm_{rev}-smp_1]}$$

Equations 6

-continued $$\Gamma_2^0 = \frac{\text{lm}_{fwd} - smp_2}{rt_{rev} + dp_2[\text{lm}_{fwd} - smp_2]}$$

The port tracking terms of the 8-term error model in FIG. 4 can be determined using the solutions for port match difference terms $\Gamma_1^0, \Gamma_2^0$ 503 and tracking conversions for $e_1^{10}e_2^{01}$ and $e_2^{10}e_1^{01}$ in Equations 5. This is shown in Equations 7.

Equations 7

$$\Gamma_2^0 = \frac{\text{lm}_{fwd} - smp_2}{rt_{rev} + dp_2[\text{lm}_{fwd} - smp_2]}$$

$$e_1^{10}e_2^{01} = rt_{fwd}[1 - dp_2\Gamma_2^0]$$

$$e_1^{10}e_2^{01} = rt_{fwd}\left[1 - dp_2\frac{\text{lm}_{fwd} - smp_2}{rt_{rev} + dp_2[\text{lm}_{fwd} - smp_2]}\right]$$

$$\Gamma_1^0 = \frac{\text{lm}_{rev} - smp_1}{rt_{fwd} + dp_1[\text{lm}_{rev} - smp_1]}$$

$$e_2^{10}e_1^{01} = rt_{rev}[1 - dp_1\Gamma_1^0]$$

$$e_2^{10}e_1^{01} = rt_{rev}\left[1 - dp_1\frac{\text{lm}_{rev} - smp_1}{rt_{fwd} + dp_1[\text{lm}_{rev} - smp_1]}\right]$$

The port match difference terms $\Gamma_1^0, \Gamma_2^0$ 503 are only required if the measurement hardware does not allow for the measurement of all four waves ($a_1^0$, $a_2^0$, $b_1^0$, $b_2^0$) simultaneously, for example when using a three reflectometer VNA wherein the reference reflectometer is between the source and the source transfer switch 105.

The reflectometer of the multiport measurement system 202 does not see the change in port match as it is between the source transfer switch 105 and RF source 109. The port match difference term $\Gamma_1^0$ in Equations 7 can be used when applying the source signal to $a_2^0$ (physical port P2 of the multiport measurement system 202), and can be used to calculate the $a_1^0$ reflected voltage wave. Similarly, the port match difference term $\Gamma_2^0$ term can be used when applying the source signal to $a_1^0$ (physical port P1 of the multiport measurement system 202) and can be used to calculate the $a_2^0$ reflected voltage wave.

The forward reflection tracking term $e_1^{10}e_1^{01}$ of the 12-term error model (also referred to as $rt_{fwd}$) contains two combined error correction terms that can be isolated from each other in order to be used in the 8-term error model. This will require isolating and determining one of the error terms from Equations 5, Equations 6, and Equations 7. The isolated error term can then be used to derive the remaining combined error correction terms of Equations 4. Herewith, the $e_1^{01}$ error term is the selected isolated error term to determine absolute amplitude and cross-frequency phase.

To measure the absolute amplitude of the $e_1^{01}$ error term, the amplitude calibration device 210 is connected to the multiport measurement system 202.

The single phase reference device 206 is used to determine the cross-frequency phase of the isolated error term $e_1^{01}$.

FIG. 7 illustrates an error adapter model 701 of the amplitude calibration device 210. To arrive at the absolute amplitude of the $e_1^{01}$ error term, the amplitude calibration device 210 of FIG. 2 is connected to port P1 of the multiport measurement system 202 of FIG. 2. The incident power of the amplitude calibration device 210 is identified for the purposes of deriving the absolute amplitude of the $e_1^{01}$ error term.

The error adapter model 701 described FIG. 7 can be solved to determine the absolute amplitude of the selected error term $e_1^{01}$. All voltage waves ($a_1^0, b_1^0$) are measured when utilizing the 8-term error model. The amplitude calibration device 210 returns the power of $a_1^1$, and allows for the one port error term model to be solved with the identified value of $a_1^1$ from the amplitude calibration device 210. The match of the amplitude calibration device 210 is seen at $b_1^1$ and can be measured indirectly at port 1. The equations to derive the absolute amplitude of $e_1^{01}$ are described in Equations 8.

Equations 8

$$a_1^1 = a_1^0 e_1^{10} + b_1^1 e_1^{11}$$

$$b_1^0 = a_1^0 e_1^{00} + b_1^1 e_1^{01}$$

$$a_1^1 = \frac{1}{e_1^{01}}[b_1^0 e_1^{11} + a_1^0[e_1^{10}e_1^{01} - e_1^{00}e_1^{11}]]$$

$$|e_1^{01}|^2 = \frac{|b_1^0 e_1^{11} + a_1^0[e_1^{10}e_1^{01} - e_1^{00}e_1^{11}]|^2}{|a_1^1|^2}$$

To arrive at the cross-frequency phase of the $e_1^{01}$ error term, the single phase reference device 206 and an error adapter model 801 of FIG. 8 are employed. The single phase reference device 206 is connected to port 1 of the measurement system 251 of FIG. 2. As phase is a relative term, it is described herewith as relative to a common time reference. To isolate the cross-frequency phase of the error term $e_1^{01}$, the $a_1^0, b_1^0$ voltage waves are measured against a static reference in one of two ways. First, by having a static phase for the local oscillator (LO) 107. Second, by using a single static phase reference generator (an example of the single phase reference device 206) to normalize the measurements of the voltage waves. For example, if $x^\Phi$ represents the single static phase reference generator, the normalization factor is $(a_1^0/x^\Phi, b_1^0/x^\Phi)$. The term 'static' phase refers to the phase remaining constant at each frequency during every sweep. The phase can differ for different frequencies during a frequency sweep. The phase must remain unchanged when the same frequency is measured when repeating the frequency sweep. This single static phase reference can also be used when measuring the un-corrected voltage waves before applying error correction to get the corrected waves.

The value of the single phase reference from the single phase reference device 206 can be accurately measured by an instrument common in the art. The values of $e_\phi^{10}$ and $a_\phi^0$ can subsequently be derived from the predetermined phase value. The error model 801 in FIG. 8 can be used to determine the cross-frequency phase of the error term $e_1^{01}$. Equations 9 can then be used to construct and solve for the cross-frequency phase of the error term $e_1^{01}$.

Equations 9

$$b_1^0 = \frac{a_\phi^0 e_\phi^{10} e_1^{01} + a_1^0 e_1^{00}[1 - e_1^{11}e_\phi^{11}] + a_1^0 e_1^{10} e_\phi^{11} e_1^{01}}{1 - e_1^{11}e_\phi^{11}}$$

$$e_1^{01} = \frac{b_1^0[1 - e_1^{11}e_\phi^{11}] - a_1^0 e_1^{00} + a_1^0 e_\phi^{11}[e_1^{00}e_1^{11} - e_1^{10}e_1^{01}]}{a_\phi^0 e_\phi^{10}}$$

$$\phi(e_1^{01}) = \phi\left(\frac{\begin{bmatrix} b_1^0[1 - e_1^{11}e_\phi^{11}] - \\ a_1^0[e_1^{00} - e_\phi^{11}[e_1^{00}e_1^{11} - e_1^{10}e_1^{01}]] \end{bmatrix}}{a_\phi^0 e_\phi^{10}}\right)$$

All voltage waves ($a_1^0, b_1^0$) are measured when utilizing the 8-term error model.

The error correction matrix in Equations 10 (below) illustrates the relationship of the measured voltage waves (un-corrected) to the DUT 204 voltage waves (corrected).

Using the 8-term error model of FIG. 4, the measured voltage waves $(a_1^0, a_2^0, b_1^0, b_2^0)$ can then be related to the voltage waves $(a_1^1, b_1^1, a_2^1, b_2^1)$ at the DUT 204 by solving for the remaining error correction terms and then computing corrected voltage waves of the DUT 204.

Equations 10 illustrates the error correction matrix and contains the error correction terms that relate the measured un-corrected to the corrected device voltage waves. It assumes that each measurement port is independent from each other (i.e. negligible crosstalk between the ports). These corrected voltage waves can then be converted into a number of meaningful measurement formats, such as S-parameters, current and power.

$$\begin{bmatrix} a_1^1 \\ b_1^1 \\ a_2^1 \\ b_2^1 \end{bmatrix} = \begin{bmatrix} R_1^{00} & R_1^{01} & 0 & 0 \\ R_1^{10} & R_1^{11} & 0 & 0 \\ 0 & 0 & R_2^{00} & R_2^{01} \\ 0 & 0 & R_2^{10} & R_2^{11} \end{bmatrix} \begin{bmatrix} a_1^0 \\ b_1^0 \\ a_2^0 \\ b_2^0 \end{bmatrix} \quad \text{Equations 10}$$

$R_x^y$ are elements of the error correction matrix generated from the 8-term error model of FIG. 4.

The $R_x^y$ error matrix elements are related to the 8-term error correction terms in Equations 11.

$$R_1^{00} = \frac{1}{e_1^{01}}[e_1^{10}e_1^{01} - e_1^{00}e_1^{11}] \quad \text{Equations 11}$$

$$R_1^{01} = \frac{1}{e_1^{01}}[e_1^{11}]$$

$$R_1^{10} = \frac{1}{e_1^{01}}[-e_1^{00}]$$

$$R_1^{11} = \frac{1}{e_1^{01}}$$

$$R_2^{00} = \frac{1}{e_2^{01}}[e_2^{10}e_2^{01} - e_2^{00}e_2^{11}]$$

$$R_2^{01} = \frac{1}{e_2^{01}}[e_2^{11}]$$

$$R_2^{10} = \frac{1}{e_2^{01}}[-e_2^{00}]$$

$$R_2^{11} = \frac{1}{e_2^{01}}$$

In the method described above, the $e_1^{01}$ error correction term is used to determine the absolute amplitude and cross-frequency phase at all frequencies of interest. To get the absolute amplitude and cross-frequency phase of port P2, the formulations in Equations 5, Equations 6, Equations 7, and the port P1 isolated error correction terms are employed again.

The error correction terms $e_1^{01}$ and $e_2^{01}$ are contained in each term of the error correction matrix show in Equations 11. Equations 11 provide the absolute nonlinear error correction since the absolute amplitude and cross-frequency phase of each error correction term are known. These error correction terms $e_1^{01}$ or $e_2^{01}$ (using Equations 10 and 11) relate the cross-frequency phase of the uncorrected to the corrected voltage waves in the matrix of Equations 10. The calibration method also requires that the measured un-corrected voltage waves be measured against $(a_1^0/x^\Phi, a_2^0/x^\Phi, b_1^0/x^\Phi, b_2^0/x^\Phi)$ the static phase of the LO 107 as used during the isolation of the cross-frequency phase of the $e_1^{01}$ error term.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems, for example, as discussed above.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method for calibrating a multiport measurement system having a local oscillator and a respective receiver associated with each port, the method comprising:
    performing a relative calibration by vector calibrating ports of the multiport measurement system and generating relative error-correction terms for the ports of the multiport measurement system; and
    performing an absolute calibration by calibrating an amplitude response of the receivers of the multiport measurement system, and removing a local oscillator unknown phase response using a phase reference coupled to a vector calibrated port and transferring cross-frequency phase correction terms from this vector calibrated port to the receivers of other vector calibrated ports.

2. The method of claim 1, wherein performing the relative calibration includes the use of a vector calibration device for vector calibrating the ports of the multiport measurement system.

3. The method of claim 2, wherein the vector calibration device comprises at least one of an electronic calibration (ecal) module and a short/open/load/through (SOLT) calibration kit.

4. The method of claim 1, wherein performing the absolute calibration includes the use of an amplitude calibration device coupled to a vector calibrated port for calibrating an un-ratioed amplitude response of the receivers.

5. The method of claim 4, wherein the amplitude calibration device comprises a power sensor.

6. The method of claim 1, wherein generating relative error-correction terms comprises generating a matrix of relative error-correction coefficients.

7. The method of claim 1, wherein transferring cross-frequency phase correction terms to the receivers of the other vector calibrated ports is based upon the relative calibration.

8. The method of claim 1, wherein the multiport measurement system is one of a multiport vector network analyzer, a multiport oscilloscope and a multiport vector signal analyzer.

9. A method of operating a multiport vector network analyzer for testing a device under test (DUT), the multiport vector network analyzer having a local oscillator and a respective receiver associated with each port, the method comprising:
  calibrating the multiport vector network analyzer by:
    performing a relative calibration by vector calibrating ports of the multiport vector network analyzer by coupling a vector calibration device to each of the ports and generating relative error-correction terms for the ports of the multiport measurement system, and performing an absolute calibration by calibrating an amplitude response of the receivers of the multiport vector network analyzer by coupling an amplitude calibration device to one of the vector calibrated ports, and removing a local oscillator unknown phase response by coupling a phase reference to a vector calibrated port and transferring cross-frequency phase correction terms from this vector calibrated port to the receivers of the other vector calibrated ports; and
  testing the DUT using the ports of the multiport vector network analyzer to apply and receive measurement signals.

10. The method of claim 9, wherein the amplitude calibration device comprises a power sensor.

11. The method of claim 9, wherein generating relative error-correction terms comprises generating a matrix of relative error-correction coefficients.

12. The method of claim 9, wherein transferring cross-frequency phase correction terms to the receivers of the other vector calibrated ports is based upon the relative calibration.

13. A non-transitory computer-readable storage medium having stored therein machine readable instructions configured to be executed by a multiport measurement system having a local oscillator and a respective receiver associated with each port, the machine readable instructions being configured to cause the multiport measurement system to execute a process for calibrating the multiport measurement system, the process comprising:
  performing a relative calibration by vector calibrating ports of the multiport measurement system and generating relative error-correction terms for the ports of the multiport measurement system; and performing an absolute calibration by calibrating an amplitude response of the receivers of the multiport measurement system, and removing a local oscillator unknown phase response using a phase reference coupled to a vector calibrated port and transferring cross-frequency phase correction terms from this vector calibrated port to the receivers of the other vector calibrated ports.

14. The non-transitory computer-readable storage medium of claim 13, wherein performing the relative calibration includes the use of a vector calibration device for vector calibrating the ports of the multiport measurement system.

15. The non-transitory computer-readable storage medium of claim 14, wherein the vector calibration device comprises at least one of an electronic calibration module and a short/open/load/through calibration kit.

16. The non-transitory computer-readable storage medium of claim 13, wherein performing the absolute calibration includes the use of an amplitude calibration device coupled to a vector calibrated port for calibrating an un-ratioed amplitude response of the receivers.

17. The non-transitory computer-readable storage medium of claim 16, wherein the amplitude calibration device comprises a power sensor.

18. The non-transitory computer-readable storage medium of claim 13, wherein generating relative error-correction terms comprises generating a matrix of relative error-correction coefficients.

19. The non-transitory computer-readable storage medium of claim 13, wherein transferring cross-frequency phase correction terms to the receivers of the other vector calibrated ports is based upon the relative calibration.

20. The non-transitory computer-readable storage medium of claim 13, wherein the multiport measurement system is one of a multiport vector network analyzer, a multiport oscilloscope and a multiport vector signal analyzer.

* * * * *